United States Patent [19]
Nishizawa

[11] Patent Number: 5,485,017
[45] Date of Patent: Jan. 16, 1996

[54] SEMICONDUCTOR DEVICE AND METHOD OF MANUFACTURING SAME

[75] Inventor: Jun-ichi Nishizawa, Sendai, Japan

[73] Assignee: Zaidan Hojin Handotai Kenkyu Shinkokai, Miyagi, Japan

[21] Appl. No.: 241,447

[22] Filed: May 11, 1994

[30] Foreign Application Priority Data

May 12, 1993 [JP] Japan .................................. 5-147128

[51] Int. Cl.$^6$ ...................... H01L 29/06; H01L 21/265
[52] U.S. Cl. ............................ 257/24; 257/30; 257/38; 257/46; 257/104; 257/136; 257/498; 257/458; 257/523; 437/40; 437/81; 437/105; 437/107; 437/126; 437/228
[58] Field of Search ........................... 257/24, 30, 38, 257/46, 104, 136, 458, 523, 498; 437/40, 81, 105, 107, 126, 228

[56] References Cited

U.S. PATENT DOCUMENTS

| | | | |
|---|---|---|---|
| 4,841,350 | 6/1989 | Nishizawa | 257/136 |
| 5,216,262 | 6/1993 | Tsu | 257/24 |

OTHER PUBLICATIONS

Nishizawa et al., "High Speed and High Density Static Induction Transistor Memory" (Oct. 1978), IEEE Journal of Solid–State Circuits, vol. SC–13, No. 5, pp. 622–634.

*Primary Examiner*—Edward Wojciechowicz
*Attorney, Agent, or Firm*—Fish & Richardson

[57] ABSTRACT

A semiconductor device has an $n^+$ source region, a first $n^-$ channel region, a barrier layer, a second $n^-$ channel region, a pair of $n^+$ drain regions, an insulating film, and a pair of metal electrodes over the respective $n^+$ drain regions, all successively disposed on an upper surface of an $n^+$ crystal substrate. The drain regions and the metal electrodes jointly provide a storage electric capacitance. A source electrode is disposed on the lower surface of the $n^+$ crystal substrate. Bit information can be written and read at a high speed by tunneling through the barrier layer. According to a method of manufacturing the above semiconductor device, the $n^+$ source region, the first $n^-$ channel region, the barrier layer, the second $n^-$ channel region, the $n^+$ drain regions, the insulating film, and the metal electrodes are successively deposited on the $n^+$ crystal substrate in a growing apparatus. The metal electrodes and the source electrode are formed by depositing a metal and a low-resistance semiconductor selectively or both in one location within the growing apparatus.

15 Claims, 8 Drawing Sheets

SEMICONDUCTOR DEVICE AND METHOD OF MANUFACTURING SAME

BACKGROUND OF THE INVENTION

1. Field of the Invention

The present invention relates to a semiconductor device for use in a logic integrated circuit, a semiconductor memory, or the like which is incorporated in an electronic computer, a main storage device thereof, an office-automation device, a personal computer, a game device, or the like, the semiconductor device having a structure capable of reading and writing data at high speed and suitable for high-density integration, and a method of manufacturing such a semiconductor device which has a potential barrier controllable by an external bias to generate an optimum potential barrier.

2. Description of the Prior Art

Recent years have been seeing a rapid progress in high-speed semiconductor devices and highly integrated semiconductor devices. Particularly, efforts that have heretofore been made to produce highly integrated semiconductor devices have resulted in a mass production of 16-Mbit memories, and have also revealed a 64-Mbit memory prototype.

However, conventional attempts to achieve a higher degree of integration for semiconductor devices have been encountering some problems. Specifically, simply reducing the size of the structure of a present semiconductor memory configuration of the MOS (metal oxide semiconductor) type or VMOS (V-groove metal oxide semiconductor) type would cause the number of electrons that contribute to the operation of the semiconductor memory to be reduced closely to a noise level, making it difficult to control the operation of the semiconductor memory. This drawback is serious with respect to 64-Gbit memories where the number of electrons involved in the memory operation is about 100 or less. The problem is not only limited to semiconductor memories, but also applies to semiconductor devices which are affected by the number of operating electrons.

To alleviate the above shortcomings, the inventor has already proposed a semiconductor memory composed of basic memory cells each comprising a static inductor transistor (SIT) (see IEEE Journal of solid-state circuits, vol. SC-13, No. 5, October 1978, p. 622, "High Speed and High Density Static Induction Transistor Memory").

SIT memories are classified by circuit operation into a two-terminal memory (ping-pong memory) and a three-terminal memory (purse memory). Semiconductor memories are basically brought under three categories, i.e., a serial memory or shift register, a random-access memory (RAM), and a read-only memory (ROM), by the manner in which they store in formation. The inventor has disclosed in the above publication that the semiconductor memories of the three types can be constructed of SITs.

The SIT memories can be integrated to a scale several times greater than presently available MOS or VMOS memories because the SIT memories can be arranged in a three-dimensional structure by embedding part of the memory in the semiconductor substrate. The SIT memories operate at very high speed owing to bulk conduction rather than surface conduction, and can be constructed for high storage capacity due to a low power requirement.

SIT ping-pong memories and purse memories have their characteristics of holding stored information depending on the intrinsic gate potential which is determined by the difference between the Fermi level in the vicinity of a MOS capacitor on a drain region which is a storage region and the potential of a source region. Therefore, as electrons are stored in an electron-storage-type memory, the potential of the memory increases and the intrinsic gate potential under goes a corresponding reduction, with the result that the leak current increases and the holding characteristics of the electron-storage-type memory are degraded. In order to improve the holding characteristics, a reverse gate bias may be applied in advance, which would require a high voltage to be applied upon reading and writing information.

When a charge is stored in an electron-depletion-type memory, the potential of the memory decreases and the intrinsic gate potential increases, thus improving the holding characteristics of the memory. However, the rate at which information can be read from and written in the electron-depletion-type memory is lower than that of the electron-storage-type memory.

In the SIT memories, since the surface storage electric capacitance is driven in principle by a static induction transistor, it is necessary to form $p^+$ gate regions as lands in an $n^-$ channel region so as to cause pinchoff in the $n^-$ channel region. The SIT memories control the carrier transport between the storage region and the source region by controlling the intrinsic gate potential which is developed between an $n^+$ drain region formed between the $p^+$ gate regions and an $n^+$ source region formed in a position that confronts the $n^+$ drain region. Specifically, the carrier transport is controlled by a static induction effect caused by a voltage applied to the surface electrode in a gate-floating two-terminal SIT memory configuration, and by both a static induction effect caused by a voltage applied to the surface electrode and an intrinsic gate potential developed by an external gate voltage in a gate-floating three-terminal SIT memory configuration.

Therefore, the conventional SIT memories remain to be improved for high-speed and low-noise operation since the carrier transport that is carried out between the storage region and the source region under the intrinsic gate potential control is governed by the Boltzmann's formula.

Figure 1:
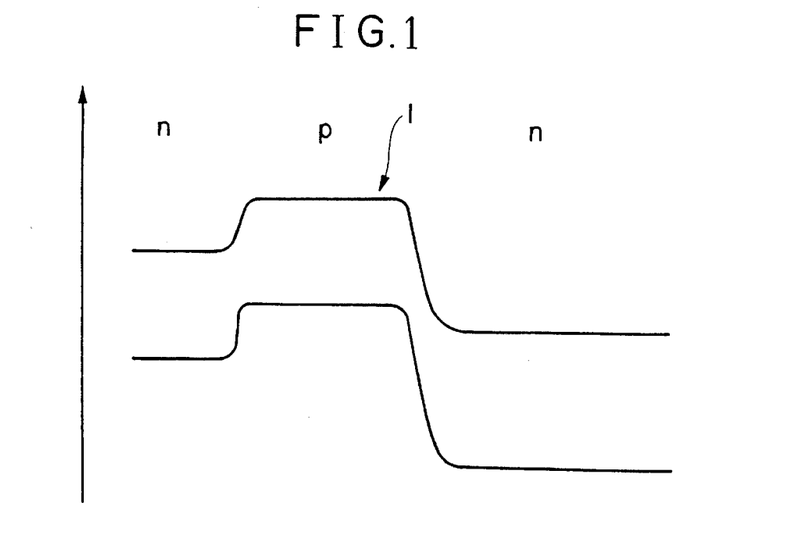
FIG. 1 is a diagram showing the potential distribution of an npn-type bipolar transistor.

Transistors, e.g., npn-type bipolar transistors (BPT), have a neutral region left in a junction barrier layer. FIG. 1 of the accompanying drawings shows the potential distribution of an npn-type bipolar transistor. In FIG. 1, no electric field is applied because a flat area is left in the potential of a barrier layer top region 1. Therefore, for storing a carrier such as electrons from a source region into a storage region and drawing the carrier from the storage region into the source region in writing and reading modes during operation of a semiconductor memory, the carrier has to be transferred by way of diffusion through the flat-potential region of the barrier layer, imposing a limitation on high-speed memory operation. The presence of the neutral region prevents the height and width of the potential barrier from being controlled by the static induction effect. Consequently, conventional transistors such as npn-type bipolar transistors have room to be improved for operation at higher speeds.

Fabrication of semiconductor devices such as semiconductor memories has to rely on crystal growth processes with film thickness controllability for controlling film thicknesses in units of molecular layers of semiconductor crystals and also with positional controllability. Specifically, low-temperature growth and low-temperature fabrication processes are required because a semiconductor device has to be fabricated based on sharp control of an impurity distribution and a crystal composition in units of a single molecular layer of crystals.

Crystal growth processes which meet the above requirements include a molecular beam epitaxy (MBE) process, a metal organic chemical vapor deposition (MOCVD) process, and a molecular layer epitaxy (MLE) process.

The MBE process, which is essentially an evaporation process, does not ensure molecular layer growth in principle in its growth process though it can control a film thickness in units of a single molecular layer. In order to produce a crystal of good quality with the MBE process, the growth temperature of the conventional MBE process is about 200° C. higher than that of the MLE process. Because the Debye temperature of gallium arsenide (GaAs) is of about 360K in a temperature range of 140K or higher, the process temperature difference of 200° C. is highly conducive to the generation of defects in the device. It is difficult for the MOCVD process, which employs a metal organic gas, to produce highly thin layers of good quality successively in reality in view of the requirements for appropriate low process temperatures and film thickness/composition controllability in units of a single molecular layer.

Among the above three processes, the MLE process is most suitable for meeting the above requirements as it allow a crystal to grow one molecular layer by one molecular layer at low temperatures. To form a metal electrode after a semiconductor crystal of one molecular layer has grown, the semiconductor crystal is taken out of an MLE chamber and then surface-treated, and thereafter a metal electrode is formed on the semiconductor crystal by evaporation. Since the MLE process includes a step where the semiconductor crystal is exposed to air, an oxide layer grows on the surface of the semiconductor crystal. Therefore, the MLE process needs an improvement with respect to the formation of a metal-to-semiconductor contact of good quality.

SUMMARY OF THE INVENTION

It is a first object of the present invention to provide a semiconductor device which can control a potential barrier formed therein by an external electric field for operation at ultrahigh speeds.

A second object of the present invention is to provide a semiconductor device having a low noise level and a low power requirement, which can operate at ultrahigh speeds, has improved characteristics of holding stored charges, and is capable of reading and writing information at high speeds.

A third object of the present invention is to provide a semiconductor device which can control a pnp- or npn-junction barrier with an external electric field and can operate at ultrahigh speeds.

A fourth object of the present invention is to provide a method of manufacturing a semiconductor device to form a semiconductor contact of good quality between a metal electrode and a semiconductor electrode, and to form a gate mesa by way of low-temperature etching.

To achieve the first object, there is provided a semiconductor device comprising a semiconductor substrate, a source region disposed on the semiconductor substrate, a channel region disposed on the source region, a drain region disposed on the channel region, an insulating layer disposed on the drain region, an electrode disposed on the insulating layer, and a very thin barrier layer disposed in the channel region between the source region and the drain region, the very thin barrier layer having a potential developed therein which is controllable by an external voltage applied thereto.

To achieve the second object, there is provided a semiconductor device comprising a semiconductor substrate, a source region disposed on the semiconductor substrate, a channel region disposed on the source region, a drain region disposed on the channel region, a charge storage layer disposed on the channel region, an insulating layer disposed on the charge storage layer, an electrode disposed on the insulating layer, and a very thin barrier layer disposed in the channel region between the source region and the drain region, the very thin barrier layer having a potential developed therein which is controllable by an external voltage applied thereto.

To achieve the third object, there is provided a semiconductor device comprising a laminated structure composed of a drain region, a barrier layer, and a source region, the barrier layer comprising a very thin layer, the laminated structure being free of a metallurgical channel region.

There is also provided a semiconductor device comprising a semiconductor substrate, a source region disposed on the semiconductor substrate, a first channel region disposed on the source region, a very thin barrier layer disposed on the first channel region for developing an intrinsic gate potential, a second channel region disposed on the very thin barrier layer, a drain region disposed on the second channel region, an insulating layer disposed on the drain region, and an electrode disposed on the insulating layer, the arrangement being such that the distance between the drain region and a saddle of the intrinsic gate potential developed by the very thin barrier layer is equal to or less than a mean free path.

The very thin barrier layer may be of a very thin homo junction structure.

Alternatively, the very thin barrier layer may of a very thin heterojunction structure.

Alternatively, the very thin barrier layer may comprise a very thin insulating layer.

Alternatively, the very thin barrier layer may be formed of a very thin heterojunction for developing a quantum well potential.

According to the present invention, the fourth object can be achieved by a method of manufacturing a semiconductor device with a growing apparatus, comprising the steps of forming a source region on a semiconductor substrate, forming a first channel region on the source region, forming a barrier layer on the first channel region, forming a second channel region on the barrier layer, forming a drain region on the second channel region, forming an insulating layer on the drain region, forming a surface electrode on the insulating layer over the drain region, and forming a source electrode on the semiconductor substrate, the arrangement being such that the surface electrode and the source electrode are formed by depositing a metal and a low-resistance semiconductor selectively or both in situ within the growing apparatus.

The step of forming the source region may include the step of previously surface-treating a GaAs crystal substrate in an AsH$_3$ atmosphere at a predetermined temperature.

There is further provided a method of manufacturing a semiconductor device, comprising the steps of forming a source region on a semiconductor substrate, forming a first channel region on the source region, forming a barrier layer on the first channel region, forming a second channel region on the barrier layer, forming a drain region on the second channel region, forming an insulating layer on the drain region, forming a gate mesa, forming a gate region on the gate mesa, forming a surface electrode on the insulating layer over the drain region, and forming a source electrode on the semiconductor substrate, the step of forming a gate mesa being carried out in situ by an etching process with a radiation at a low temperature.

The etching process may comprise a molecular layer etching process with a chlorine gas adsorbed to the surface of a GaAs crystal substrate. The step of forming the source region may include the step of previously surface-treating a GaAs crystal substrate in an AsH$_3$ atmosphere at a predetermined temperature.

As described above, the semiconductor device according to the present invention has a depletion layer in a very thin barrier layer, and allows the height and width of the potential of the very thin barrier layer to be controlled under an external electric field, and the very thin barrier layer serves as a tunnel barrier layer for permitting a carrier to be written and read by tunneling therethrough.

Since the carrier tunnels through an intrinsic gate region formed by the tunnel barrier layer, desired information can be read and written at a high speed. The semiconductor device suffers low noise as the tunneling is used to transfer the carrier, so that the semiconductor device can operate with a reduced number of electrons that contribute to the operation. The movement of the carrier by the tunneling permits the semiconductor device to have a low power requirement.

Where the semiconductor device is constructed as a semiconductor memory for storing a carrier, it is possible to eliminate a leak current which would otherwise be caused by the stored carrier, with the potential of the very thin barrier layer. Since the height and width of the potential of the very thin barrier layer can be controlled for tunneling, the stored carrier tunnels through the intrinsic gate region formed by the tunnel barrier layer, so that desired information can be read and written at a high speed.

With an arrangement in which a quantum-well-like potential distribution is developed, the gate potential can be controlled by a gate bias voltage. When quantization levels developed in the gate region are equalized to each other, there is produced a tunnel transition probability, allowing a charge to move. Since such a phenomenon is a quantum phenomenon, the response time can be shortened in principle to a limit time range that can be observed according to the uncertainty principle. As the charge is transferred by the tunneling, if the quantization levels developed in the gate region do not agree with each other, it is possible to block and retain bit information with a very small leak current.

In a semiconductor device having npn or pnp junctions between a drain region, a very thin barrier layer, and a source region with the very thin barrier layer interposed between the drain and source regions, there exist depletion layers which meet charge neutralizing conditions even if no channel layers are present, and the depletion layers serve as virtual channel layers. Inasmuch as the potential height and width of the depletion layers can be controlled by an external electric field, the semiconductor device can operate at a high speed and can be of a highly integrated circuit design.

In a semiconductor device wherein a drain region serves as a charge storage region and the distance between the charge storage region and the saddle of an intrinsic gate potential developed by a tunnel barrier layer is equal to or smaller than the mean free path of a carrier, the carrier stored in the storage region does not reach the intrinsic gate region by way of diffusion, but by way of ballistic conduction.

Consequently, even if the carrier does not tunnel through the potential of the barrier layer, a change in a current caused by a change in the height of the potential of the barrier layer can be increased, making it possible to increase the operating speed of the semiconductor device. The semiconductor device can be of a highly integrated circuit design, and can produce a sufficient signal even if the number of stored carriers is reduced.

According to a process of fabricating a semiconductor device, the step of forming electrodes is not effected outside of a growing apparatus, but the deposition of a metal and the deposition of a low-resistance semiconductor are selectively or both carried out in the same location. Therefore, there is no processing step where the device being fabricated is exposed to air.

Consequently, no oxide film is produced on the surface of a crystal which has grown, so that a good electrode-to-semiconductor contact can be formed.

According to a process of forming a gate mesa region, the step of fabricating the gate mesa is not effected outside of a growing apparatus, but the device is selectively etched with a radiation at a low temperature in the same location. Therefore, an npn structure which is about one molecular layer thick is not damaged, and a side wall being formed is not damaged.

The surface is processed in an AsH$_3$ atmosphere in a step preceding the step of forming a source region. In this manner, a grown interface of good quality can be produced without damaging a very thin npn structure which is about one molecular layer thick.

The present invention will be understood more fully from the detailed description given herebelow and from the accompanying drawings of the preferred embodiments of the invention, which, however, should not be taken to be limitative to the invention, but are for explanation and understanding only.

DETAILED DESCRIPTION OF THE PREFERRED EMBODIMENTS

A semiconductor device according to a first embodiment of the present invention will be described below. In the first embodiment, a barrier layer according to the present invention is incorporated in a two-terminal memory.

Figure 2:
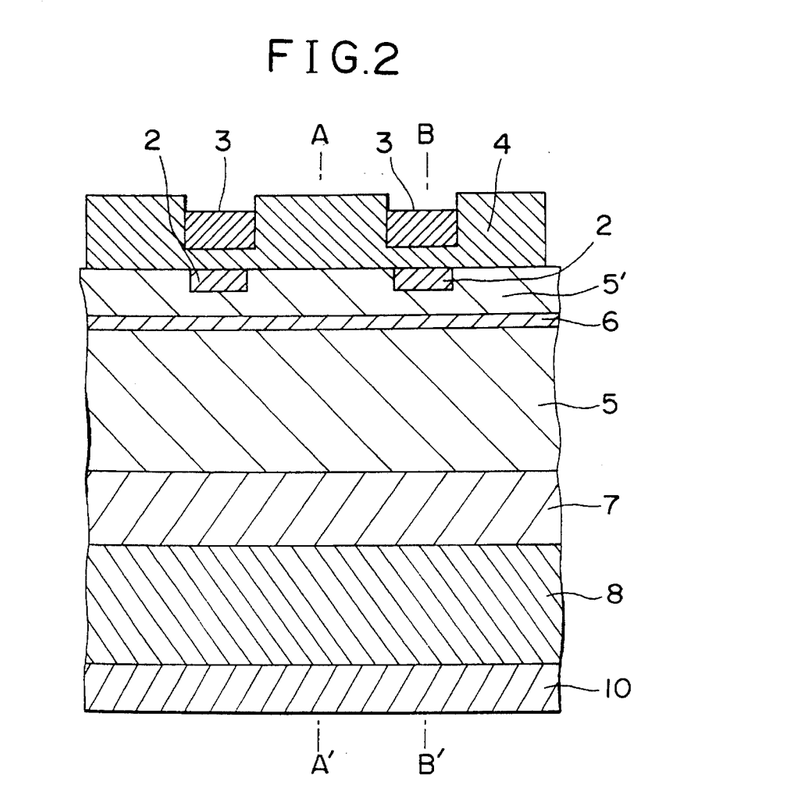
FIG. 2 is a fragmentary cross-sectional view of a semiconductor device according to a first embodiment of the present invention.

FIG. 2 shows in cross section the semiconductor device according to the first embodiment of the present invention. The semiconductor device according to the first embodiment includes a semiconductor substrate of $n^+$-GaAs crystal. As shown in FIG. 2, the semiconductor device has an $n^+$ substrate crystal 8, an $n^+$ source region 7 disposed on the $n^+$ substrate crystal 8, a first $n^-$ channel region 5 disposed on the $n^+$ source region 7, a barrier layer 6 disposed on the first $n^-$ channel region 5, a second $n^-$ channel region 5' disposed on the barrier layer 6, a pair of $n^+$ drain regions 2 disposed in the second $n^-$ channel region 5', an insulating film 4 disposed on the second $n^-$ channel region 5' and the $n^+$ drain regions 2, and a pair of metal electrodes 3 disposed in the insulating film 4 over the respective $n^+$ drain regions 2. The $n^+$ drain regions 2 and the metal electrodes 3 jointly form an electrostatic capacitance. A source electrode 10 is formed on the lower surface of the $n^+$ substrate crystal 8.

The $n^+$ drain regions 2 have a carrier density of $5 \times 10^{18}$/cc with selenium added, for example, and a thickness of about several hundreds Å. The first $n_-$ channel region 5 has a thickness of about 1500Å, and the second $n^-$ channel region 5' has a thickness of about 300Å. Both of the first and second $n^-$ channel region 5, 5' comprise a highly pure grown layer having a carrier density of $1 \times 10^{17}$/cc or lower. The barrier layer 6 has a carrier density of $1 \times 10^{19}$/cc or higher, and a thickness ranging from about several Å to several tens Å. The $n^+$ source region 7 has a carrier density of $5 \times 10^{18}$/cc with selenium added, for example, and a thickness ranging from about several hundreds A to several thousands A. The $n^+$ substrate crystal 8 is in the form of a silicon-added GaAs substrate crystal having a carrier density of $2 \times 10^{18}$/cc. The source electrode 10 may be of any of various structures which form a good low-resistance metal-to-semiconductor contact with respect to the $n^-$ type GaAs crystal. For example, the source electrode 10 may be made of gold germanium/nickel/gold (AuGe/Ni/Au) which is a material that has heretofore widely been employed in the art.

A process of manufacturing the semiconductor device shown in FIG. 2 will be described below.

To fabricate the semiconductor device shown in FIG. 2, it is necessary to rely on crystal growth processes with film thickness controllability for controlling film thicknesses in units of molecular layers of semiconductor crystals and also with positional controllability. Since the semiconductor device has to be fabricated based on sharp control of an impurity distribution and a crystal composition in units of a single molecular layer of crystals, there is employed a molecular layer epitaxy (MLE) process which allows low-temperature growth and low-temperature fabrication. The molecular layer epitaxy process is applicable to not only a compound semiconductor crystal such as GaAs, but also silicon.

While the crystal may be grown by a metal organic chemical vapor deposition (MOCVD) process which employs an organic metal gas, the process is required to have a suitable low process temperature and film thickness/composition controllability in units of a single molecular layer.

The fabrication process based on the MLE will be described below with reference to FIG. 2.

First, an $n^+$ source region 7 having a thickness of about 5000 Å for example, is grown on an $n^+$-GaAs substrate crystal 8 having a {100} orientation. Thereafter, a first $n^-$ channel region 5 having a thickness of about 1500 Å and a $p^+$ barrier layer 6 which is several molecular layers thick are successively grown on the $n^+$ source region 7. Then, a second $n^-$ channel region 5' having a thickness of several hundreds Å is grown on the barrier layer 6. In this manner, an npn structure is formed successively of these layers.

An impurity added to each of the $n^+$ drain regions 2 and the $n^+$ source region 7 is selenium (Se), for example, which may be introduced by a material gas of diethyl selenium (DESe), for example, after arsine ($ASH_3$) upon molecular layer epitaxy. Typically, these regions are grown at a temperature of about 420° C. When grown by the MLE process, each of these regions comprises a heavily doped n-type conductive layer having a carrier density of $5 \times 10^{18}$/cc or $4 \times 10^{19}$/cc as a contact layer. In this embodiment, an impurity-added layer having a carrier density of $5 \times 10^{18}$/cc is formed.

The $p^+$ barrier layer 6 contains an impurity of zinc (Zn), beryllium (Be), carbon (C), or the like added thereto. The impurity may be introduced by a material gas of diethyl zinc (DEZn), diethyl beryllium (DEBe), or the like. If an impurity of C is added, then molecular layer epitaxy is carried out using trimethyl gallium (TMG) and $AsH_3$, and C from TMG is used as an acceptor impurity. The amount of C which is mixed can be controlled by growth conditions. Alternatively, TMG may be mixed upon molecular layer epitaxy using triethyl gallium (TEG) and $AsH_3$. In this embodiment, the $p^+$ barrier layer 6 which is formed has a carrier density of $1.5 \times 10^{19}$/cc and a thickness of 16 Å. The $p^+$ barrier layer 6 has a two-dimensional carrier density of $2.4 \times 10^{12}$/cm$^2$ and a barrier height of about 0.8 eV.

After the npn structure has been formed, as described above, an insulating layer 4 is formed in the form of a silicon nitride film at a low temperature, and windows are defined therein by ordinary photolithography. Then, $n^+$ drain regions 2 are formed by regrowth. One of the features of the molecular layer epitaxy process is selectivity on the silicon nitride film and the GaAs crystal. Specifically, no GaAs crystal is grown on the silicon nitride film. If the silicon nitride film has a good interface and a sufficiently small surface recombination velocity, then it may be used directly as the insulating film 4 of the storage static capacitance.

If an interfacial defect density is large, then a thin-film crystal such as of aluminum gallium arsenide (AlGaAs), zinc selenium (ZnSe), or the like, for example, which has a large band gap, may be employed instead of the insulating film 4. Where a thin-film crystal of AlGaAs is used, phosphorus (P) may be added to equalize its lattice constant to that of GaAs for forming a better interface. Thereafter, in order to form a metal insulator semiconductor (MIS) or metal oxide semiconductor (MOS) capacitor, areas of the insulating film 4 over the respective drain regions 2 are reduced in thickness, and metal electrodes 3 are deposited as capacitor electrodes in the thinned areas of the insulating film 4.

Finally, a good low-resistance metal-to-semiconductor contact with respect to the $n^-$ type GaAs crystal is formed. For example, a source electrode 10 of AuGe/Ni/Au is evaporated. If a metal-to-semiconductor contact of AuGe/Ni/Au which has conventionally been employed is formed by evaporation, then there may be produced a thick alloy layer not suitable for use on a very thin multilayer semiconductor structure that is about one molecular layer thick according to the present invention even though no intentional alloying is carried out. Furthermore, no good metal-to-semiconductor contact can be expected if an electrode is formed after the grown crystal is taken out into air and surface-treated.

Therefore, a process of forming a very thin multi layer semiconductor structure by epitaxial growth and then selectively depositing a metal layer as a source electrode in the same location is suitable for the structure according to the present invention.

For example, the source electrode 10 may be formed by selective aluminum deposition by introducing a metal organic gas such as of triisobutyl aluminum, dimethyl aluminum hydride, or the like. Such an organic metal of aluminum is suitable for the fabrication of a very thin multilayer semiconductor structure that is about one molecular layer thick according to the present invention because the metal is deposited selectively on only the surface of the GaAs crystal at a low temperature in the vicinity of 200° C.

If there is a subsequent temperature-rising process such as regrowth, then a metal of high melting point such as tungsten (W), molybdenum (Mo), or the like is employed. Since a metal can be deposited at a low temperature of 400° to 500° C. or lower by using a metal organic gas source of tungsten, molybdenum, or the like such as tungsten hyxacarbonyl, or the like, such a metal of high melting point is also suitable for the fabrication of a very thin multilayer semiconductor structure that is about one molecular layer thick according to the present invention. The deposition of tungsten by tungsten fluoride through a reduction process of $AsH_3$ or $SiH_4$ is also applicable. One important factor to be considered in the formation of a low-resistance metal-to-semiconductor contact with the deposition of a metal is the semiconductor surface condition immediately before the metal is deposited, which largely affects the coverage and the electric characteristics of the semiconductor device.

Though the structure on the $n^+$ substrate crystal has been described in this embodiment, it is high effective to construct the device on a high-resistance substrate for reducing the parasitic capacitance.

Operation of the semiconductor device according to the first embodiment will be described below.

In FIG. 2, when the second channel 5' is fully in a pinchoff condition due to a diffusion potential or a certain reverse gate bias voltage between the barrier layer 6 as a $p^+$ gate and the second $n^-$ channel region 5', electrons stored in the $n^-$ type drain regions 2 are retained as they are surrounded by a potential wall corresponding to the diffusion potential or the reverse gate bias voltage, allowing the semiconductor device to operate as a memory. At this time, the drain regions 2 serve as one electrode of the storage electric capacitance.

Figure 3:
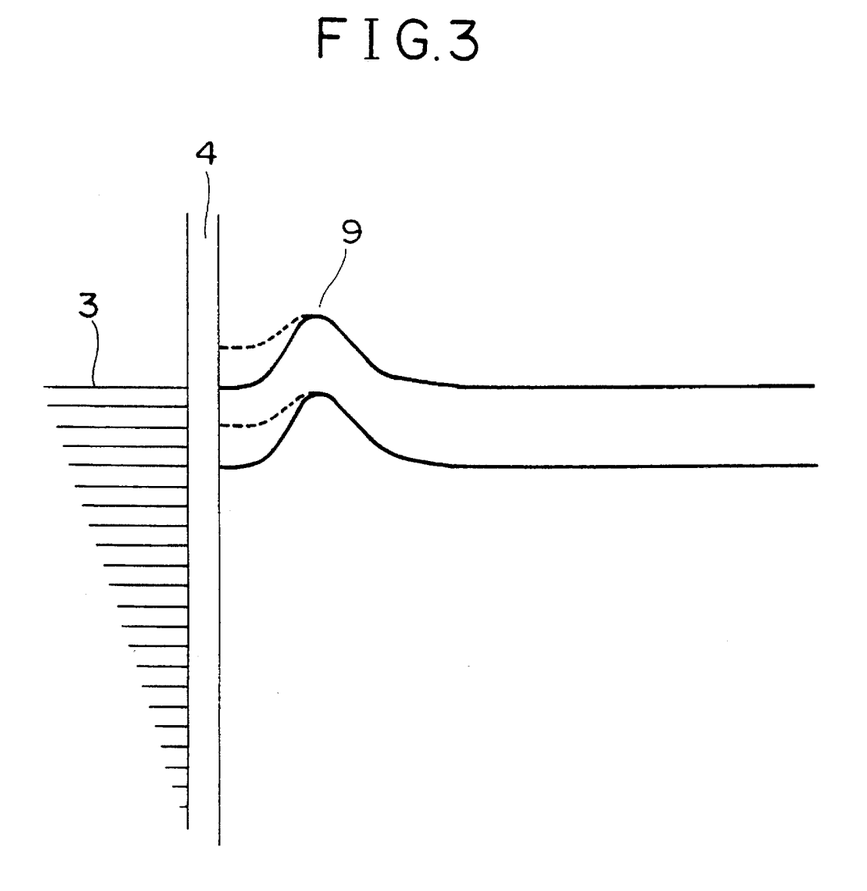
FIG. 3 is a schematic diagram of potential distributions, shown as superimposed in a semiconductor region, at a cross section taken along line A—A' of FIG. 2 in the center of a channel and a cross section taken along line B—B' of FIG. 2 in a drain region.

FIG. 3 schematically shows potential distributions, shown as superimposed in a semiconductor region, at a cross section taken along line A—A' of FIG. 2 in the center of a channel and a cross section taken along line B—B' of FIG. 2 in a drain region. In FIG. 3, the dotted-line curves represent potential distributions along the centers of the $n^-$ type channel regions 5, 5' and the solid-line curves represent potential distributions along regions including the drain regions 2.

When a positive writing pulse is applied to the surface metal electrodes 3, the potential distributions vary due to a static induction effect caused by the SIT drain voltage. Therefore, electrons in the $n^+$ source region 7 flow over the potential 9, quickly charging the surface storage electric capacitance. Inasmuch as electrons are stored, the Fermi level and the potential distributions vary in a direction toward a higher energy. Therefore, the time constant in the writing mode is determined by the MOS capacitor and the resistance of the npn structure. While the semiconductor device according to this embodiment is shown as being of the npn structure, it may be of a structure of opposite conductivity types.

Writing and reading operation of the semiconductor device as a two-terminal memory will be described below.

FIGS. 4(a) through 4(d) schematically show changes in potential distributions in writing and reading modes of the two-terminal memory.

Figure 4A:
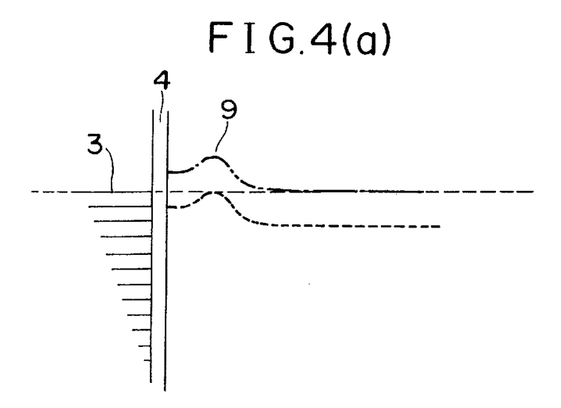
FIG. 4(a) is a schematic diagram showing a potential distribution in an initial state where a bias voltage of a two-terminal memory is zero.
Figure 4B:
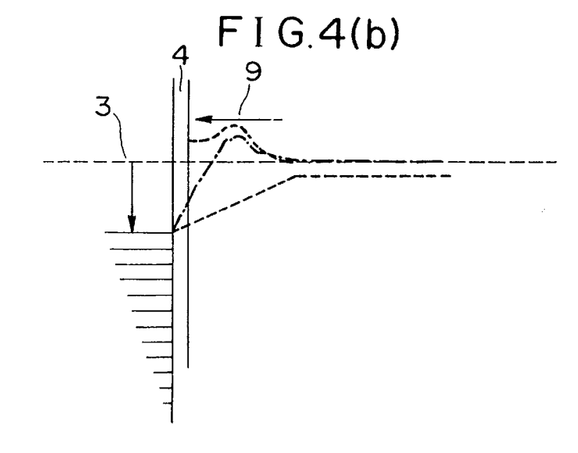
FIG. 4(b) is a schematic diagram showing a change in the potential distribution at the time when information is written in the two-terminal memory.

When no bias voltage is applied in an initial state (FIG. 4(a)), the semiconductor and the surface metal electrodes 3 have the same Fermi levels, and there exists a potential barrier 9 produced by the barrier layer 6. When a writing pulse of a positive voltage is applied to the surface metal electrodes 3, the potential thereof is lowered relatively to the semiconductor, as indicated by the arrow in FIG. 4(b). As a result, the potential barrier 9 produced by the barrier layer 6 in the semiconductor is lowered and its potential width is also lowered. Therefore, the tunnel transition probability is increased, causing electrons to be injected from the source region into the surface storage region due to the tunneling. As a consequence, the write operation is finished.

Figure 4C:
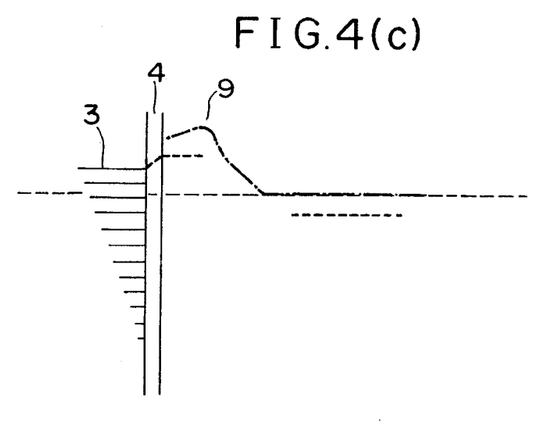
FIG. 4(c) is a schematic diagram showing a potential distribution at the time when a charge is stored in the two-terminal memory.

When electrons are stored in the storage region immediately below the surface insulating layer 4, the potential of the storage region rises due to the existence of the electrons as shown in FIG. 4(c). However, the potential barrier 9 produced by the barrier layer 6 eliminates any leak current, permitting the information represented by the stored electrons to be held well.

Figure 4D:
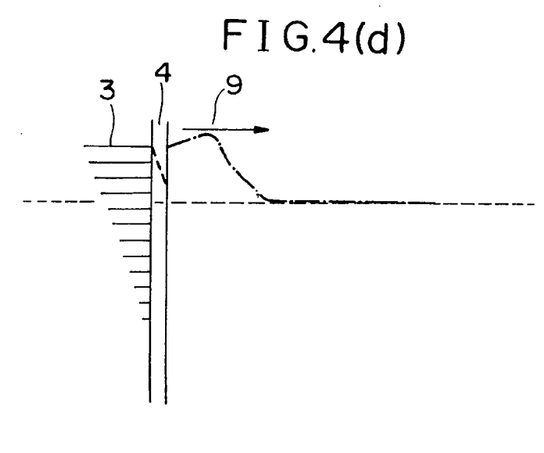
FIG. 4(d) is a schematic diagram showing a change in the potential distribution at the time when information is read from the two-terminal memory.

When a negative bias voltage pulse is applied to the surface electrodes 3, the potential thereof is increased relatively to the semiconductor, and at the same time, the potential barrier 9 of the barrier layer 6 as viewed from the charge storage layer is lowered and its width reduced. Therefore, the reading of the stored information by way of the transfer of the carrier from the charge storage layer toward the source due to the tunneling is completed at a high speed.

Since the two-terminal memory has a very thin barrier layer controllable by an external voltage, as described above, the carrier can be moved by tunneling through the intrinsic gate region formed by the tunnel barrier layer, so that information can be written and read at a high speed. The two-terminal memory has a low noise level as it relies on the tunneling, and hence can operate even if the number of electrons contributing to the operation is reduced. The two-terminal memory is essentially of a low power requirement as the carrier is moved by the tunneling.

A semiconductor device according to a second embodiment of the present invention will be described below. In the second embodiment, a barrier layer according to the present invention is incorporated as a heterojunction structure in a two-terminal memory.

Figure 5:
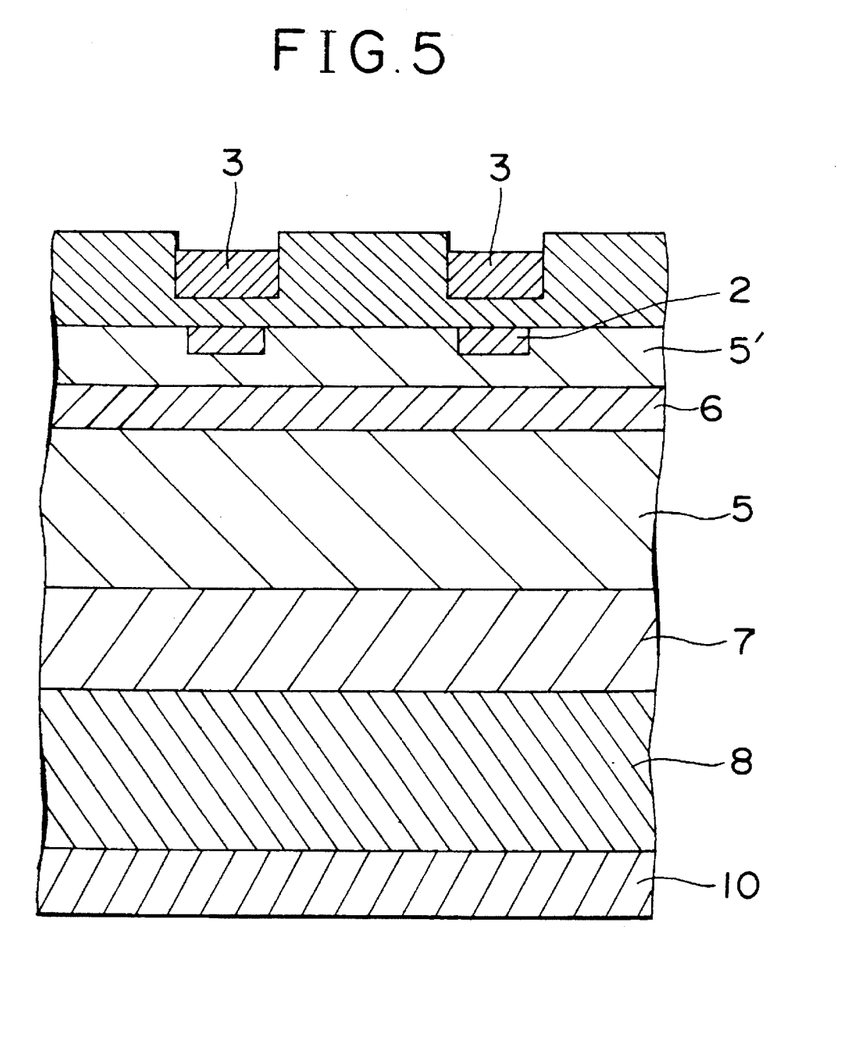
FIG. 5 is a fragmentary cross-sectional view of a semiconductor device according to a second embodiment of the present invention.

FIG. 5 shows in cross section a semiconductor device according to a second embodiment of the present invention. The semiconductor device shown in FIG. 5 is similar to the semiconductor device according to the first embodiment except that the barrier layer 6 is of a very thin heterojunction structure composed of different materials.

A process of manufacturing the semiconductor device with the very thin heterojunction structure will be described below.

Where the channel layers 5, 5' are made of GaAs as described above with respect to the first embodiment, the barrier layer may be an $Al_x Ga_{1-x} As$ or ZnSe layer where x represents an aluminum composition.

Since GaAs and $Al_x Ga_{1-x} As$ have different lattice constants, a lattice distortion is introduced in the junction interface therebetween. In order to eliminate such a lattice distortion to prevent a defect from being caused by the lattice distortion, several % of P may be added to the $Al_x Ga_{1-x} As$ layer, for example, to produce $Al_x Ga_{1-x} As_y P_{1-y}$, which is effective to remove a lattice distortion from the heterojunction interface.

The channel layers and the barrier layer are not limited to GaAs materials. Various combinations of indium arsenide (InAs) materials or the like having an electron mobility larger than GaAs materials may be made. Materials having a band gap larger than the band gap of the semiconductor materials of the channel layers 5, 5' may be used as a barrier layer material. Preferably, lattice constants and crystalline systems of the channel layer material and the barrier layer material crystal should be close to each other.

However, the lattice constants and crystalline systems of the channel layer material and the barrier layer material crystal are not required to be identical to each other. For example, silicon is of a diamond-type crystalline system, and GaAs and ZnSe are of a crystalline system where different elements are alternately positioned, as with the diamond-type crystalline system. They may match a Wurzite crystalline material such as ZnSe produced at a high temperature or a hexagonal crystalline material such as silicon carbide (SIC) at a certain face, e.g., a {111} orientation. Consequently, where the channel layers are of silicon, for example, the heterojunction barrier layer may comprise an SiC layer or a GaAs layer.

A process of manufacturing the semiconductor device with the barrier layer 6 of a heterojunction structure will be described below.

The surface of an $n^+$-GaAs substrate crystal 8 having a {100} orientation is heated to about 480° C. in an $AsH_3$ atmosphere within a crystal growth chamber to remove contaminant layers such as of surface oxide and carbide and produce a good surface finish. Thereafter, an $n^+$ source region 7 having a thickness of about 5000 Å, for example, is grown on the $n^+$-GaAs substrate crystal 8, after which a first $n^-$ channel region 5 having a thickness of about 1500 Å is grown. The higher the temperature, the better the contaminant layers such as surface oxide can be removed. If the surface of the $n^+$-GaAs substrate crystal 8 were heated to temperatures beyond 480° C., then the risk of destruction of a very thin multifilm structure which is about a molecular layer thick would be increased. Therefore, the surface of the $n^+$-GaAs substrate crystal 8 would preferably be treated at relatively low temperatures.

The $n^+$ source region 7 may be formed by introducing either a metal organic gas of TEG, TMG, or the like or a DESe gas after $AsH_3$ is introduced in a gas introduction sequence of a molecular layer epitaxial process in which a gallium chloride such as gallium trichloride or the like and $AsH_3$ are alternately introduced.

Typically, the substrate temperature ranges from 200° to 600° C., and is preferably 480° or lower. If an ultra violet radiation is applied from a high-pressure mercury vapor lamp or the like, the crystal properties can be improved by surface migration activated by the ultraviolet radiation energy though much thermally activated surface migration of surface adsorbed species is not expected because of the low-temperature growth. The substrate temperature is selected to be optimum for surface adsorption of the introduced gases and surface reactions, and may not necessarily be a constant temperature.

The carrier density can be controlled by the pressure under which the DESe gas is introduced and the time in which it is introduced. Typically, a high-density impurity-added layer having a carrier density ranging from $5 \times 10^{18}$/cc to $1 \times 10^{20}$/cc is employed. In order to reduce the effective drain-to-source distance, an impurity-added layer having an impurity density which is as high as possible is desired for each of the $n^+$ source and drain regions, and it is preferable to employ a so-called δ or digital doped layer having a carrier density of $1 \times 10^{20}$/cc or higher. An impurity gas introduced to give the crystal-grown layer an n-type conductivity is not limited to DESe, but may be a diethyl tellurium (DETe) which is an organic metal compound of Te that is a VI group element.

The $n^-$ channel layer is formed by a molecular layer epitaxy process in which TEG or the like and $AsH_3$ are alternately introduced with no intentional addition of an impurity gas. Usually, the conductivity type is an n type. For controlling the electron density more accurately, a silicon compound gas such as disilane ($Si_2H_6$) or monosilane ($SiH_4$) is introduced to add a small amount of silicon after the TEG has been introduced. Typically, the substrate temperature is also selected to be optimum for surface adsorption of the introduced gases and surface reactions, and may not necessarily be a constant temperature.

Then, a heterojunction barrier layer is formed. For forming an AlGaAs heterojunction barrier layer, a metal organic gas of aluminum such as dimethyl aluminum hydride (DMAlH), triisobutyl aluminum (TIBAl), trimethyl aluminum (TMAl), or the like is introduced from another gas inlet nozzle at the same time that the TEG is introduced. The composition of Ga and Al adsorbed to the surface is controlled depending on the ratios of the pressures under and the times for which the TEG and the organic metal gas of aluminum are introduced, and a single molecular AlGaAs layer is formed by the subsequent introduction of $ASH_3$.

Where any impurity is not intentionally added, a p-type conductive layer is typically produced in most cases. Controllability may be increased by adding an impurity gas of a II group element such as Zn, magnesium (Mg), or Be to obtain a p-type conductivity. An impurity source gas may be DEZn, dicyclopentadinyl magnesium ($Mg(Dp)_2$), DEBe, or the like. Typically, the substrate temperature is about 480° C. or lower. The substrate temperature is selected to be optimum for surface adsorption of the introduced gases and surface reactions, and may not necessarily be a constant temperature.

According to another process for forming a heterojunction barrier layer by molecular layer epitaxy, a Ga source gas such as TEG or the like and AsH$_3$ are alternately introduced to form a GaAs molecular layer, and thereafter an aluminum source gas of TIBAl or the like and AsH$_3$ are alternately introduced to alternately form aluminum arsenide (AlAs) molecular layers. Where any impurity is not intentionally added, a p-type conductive layer is typically produced in most cases. Controllability may be increased by adding an impurity gas of a II group element such as Zn, Mg, or Be to obtain a p-type conductivity. An impurity source gas may be DEZn, Mg(Dp)$_2$, DEBe, or the like. Typically, the substrate temperature is about 480° C. or lower. The substrate temperature is selected to be optimum for surface adsorption of the introduced gases and surface reactions, and may not necessarily be a constant temperature.

After the heterojunction barrier layer has been formed, a second n$^-$ channel layer 5' having a thickness of about 300 Å is formed by alternate introduction of TEG and ASH$_3$.

Subsequently, an n$^+$ drain region, an insulating layer, and metal electrodes are formed in the same manner as with the first embodiment.

The first and second n$^-$ channel layers need not exist actually for a finite thickness in a metallurgical sense. Specifically, in an npn structure composed of an n$^+$ drain region, a p$^+$ barrier layer, and an n$^+$ source region, there exist depletion layers which meet charge neutralizing conditions, rather than actual n$^-$ channel layers, for the junction between the n$^+$ drain region and the p$^+$ barrier layer and the junction between the p$^+$ barrier layer and the n$^+$ source region are effected, and the depletion layers serves as virtual channel layers.

Figure 7:
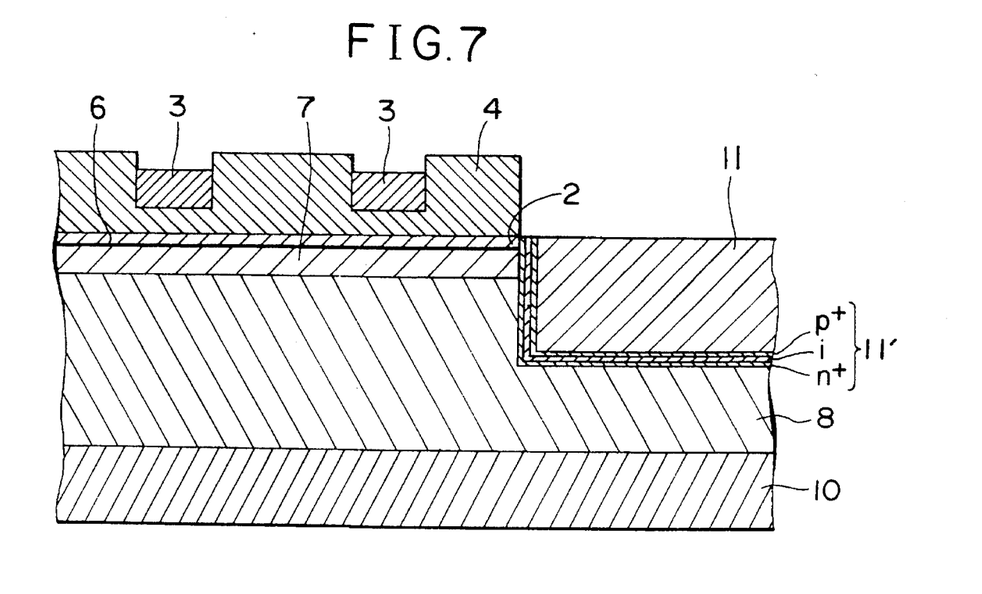
FIG. 7 is a fragmentary cross-sectional view of a device structure with no channels.

For example, in an npn structure composed of an n$^+$ drain region, a p$^+$ barrier layer, and an n$^+$ source region, if no n$^-$ channel layers are employed, and the p$^+$ barrier layer comprises a high-density impurity-added layer having an impurity density of p=9×10$^{19}$/cc and a thickness of 36 Å and each of the n$^+$ drain region and the n$^+$ source region comprises a region having an impurity density of 5×10$^{19}$/cc and a thickness of 500 Å, then virtual channel layers having a thickness of several tens Å are produced by depletion layers in both the junctions. FIG. 7 shows by way of example a device structure with no such channel layers.

While AsH$_3$ is employed as an arsenic source gas with respect to the GaAs crystalline material, the arsenic source gas is not limited to AsH$_3$, but a metal organic gas of arsenic which is less poisonous may be employed. A source gas for an indium crystalline material may be of triethyl indium (TEIn), trimethyl indium (TMIn), or the like. For a silicon crystalline material, a silicon layer may be formed by molecular layer epitaxy by alternately introducing dicyclol silane (SiH$_2$Cl$_2$) and hydrogen or alternately introducing SiH$_2$Cl$_2$ and monosilane. For ZnSe crystalline material, a source gas comprises DEZn and hydrogenated selenium (H$_2$Se) or DEZn and DESe.

Figure 6:
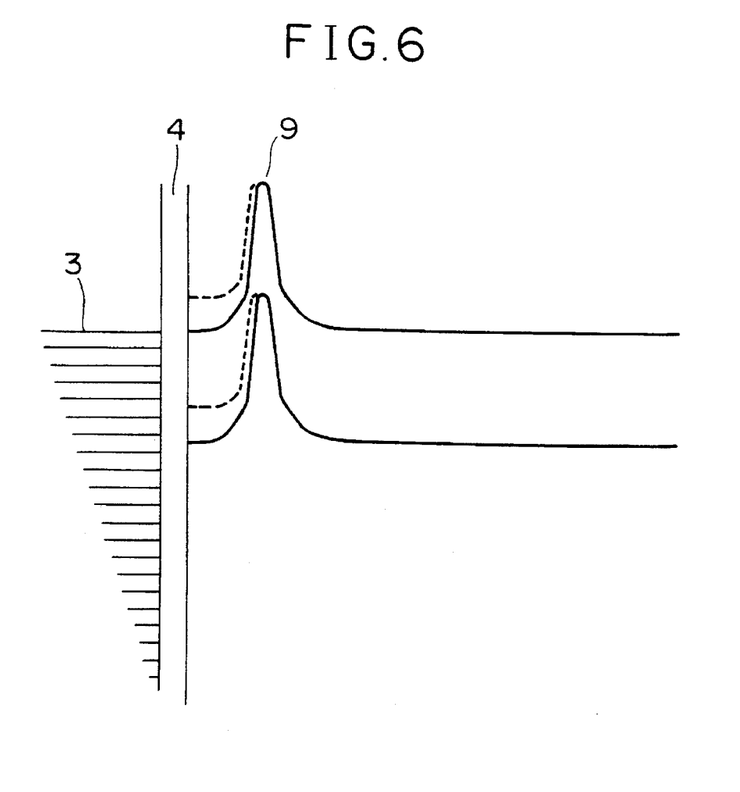
FIG. 6 is a schematic diagram of potential distributions in the case where a tunnel barrier layer is composed of a very thin hereto barrier in the semiconductor device according to the second embodiment.

The semiconductor device according to the second embodiment operates as follows:

FIG. 6 schematically shows potential distributions in the case where the barrier layer 6 is composed of a very thin hetero barrier in the semiconductor device according to the second embodiment. As shown in FIG. 6, the potential of the valence band of the very thin hetero barrier extends into the conduction band.

In FIGS. 2 and 6, when a positive writing pulse is applied to the surface metal electrodes 3, the potential distributions vary due to a static induction effect caused by the SIT drain voltage. Therefore, electrons in the n$^+$ source region 7 flow over the potential 9 due to the tunneling, quickly charging the surface storage electric capacitance. Inasmuch as electrons are stored, the Fermi level and the potential distributions vary in a direction toward a higher energy. Therefore, the time constant in the writing mode is determined by the MOS capacitor and the resistance of the npn structure.

The amount of a charge stored in the capacitor corresponds to the difference between the Fermi levels of the drain region 2 and the source region 7. This difference and the hetero barrier height determine the height of the intrinsic gate of the npn structure, and hence determines a portion of a leak current which flows beyond the intrinsic gate in the storage state, i.e., affects the holding characteristics of the memory.

In an electron storage memory, since the potential of the storage region increases, the current which flows beyond the potential 9 which serves as the intrinsic gate is considered to be large. However, the holding characteristics are high because of the hetero barrier that is present. The leak current is further reduced and the holding characteristics are further improved when a reverse gate bias voltage is applied to increase the height of the potential 9 of the intrinsic gate.

In ordinary SIT memories, when a reverse gate bias is applied, the speed at which information is written and read is lowered with the same pulse voltage. Therefore, it is necessary to increase a writing and reading voltage. According to the present invention, however, information can be written and read at high speeds as it is written and read by the tunneling through the hetero barrier.

As described above, a ping-pong memory which is a two-terminal memory has a simple arrangement and operates easily, and hence is suitable for use as a large-storage-capacity memory.

A semiconductor device according to a third embodiment of the present invention, which is employed as a three-terminal memory, will be described below.

Figure 8:
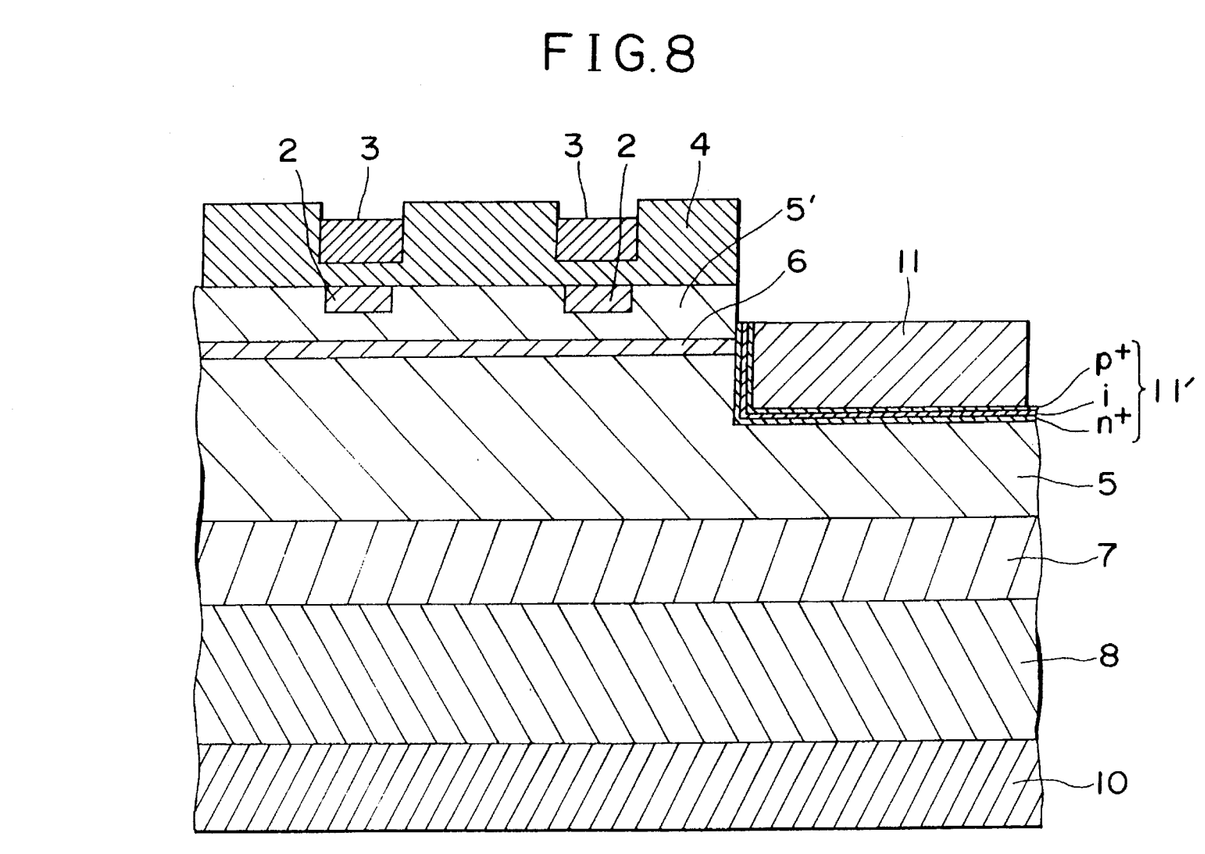
FIG. 8 is a fragmentary cross-sectional view of a semiconductor device according to a third embodiment of the present invention.

FIG. 8 shows in cross section a three-terminal memory structure as the semiconductor device according to the third embodiment. The three-terminal memory shown in FIG. 8 is similar to the semiconductor device according to the first embodiment except a gate region 11' and a gate electrode 11.

The gate region 11' has an n$^+$/i/p$^+$ structure composed of an n$^+$ layer, an i layer, and a p$^+$ layer successively arranged from a channel side wall. The n$^+$ layer of the gate region 11' is very thin and has a thickness which corresponds to several molecular layers. The n$^+$ layer of the gate region 11' has a carrier density of 4×10$^{19}$/cc with selenium added. The i layer of the gate region 11' comprises a high-purity grown layer similar to that of the channel region 5, and has a thickness of about 100 Å.

The p$^+$ layer of the gate region 11' comprises a Zn-added layer, and has a carrier density of 6×10$^{19}$/cc and a thickness of about 100 Å.

The gate region 11' may be made of any combination of metals that can form a low-resistance metal-to-semiconductor contact with GaAs. In this embodiment, the gate region 11' is made of titanium (Ti)/platinum (Pt)/gold (Au).

It has been reported that Pt of the electrode of Ti/Pt/Au serves as a barrier to prevent Au from entering the semiconductor. Actually, however, it is difficult to fully prevent Au from being diffused into the semiconductor. The electrode of Ti/Pt/Au cannot form an interface of good quality if it is formed by evaporation. Therefore, a metal depositing process which is effected subsequently to and in the same location(in situ) as the epitaxial process is suitable for the fabrication of a very thin multilayer semiconductor structure that is about one molecular layer thick according to the present invention.

The structure shown in FIG. 8 cannot be heat-treated at high temperatures as it is composed of a number of thin layers. Therefore, the metal electrodes such as the source electrode 10, the gate electrode 11, etc., are produced in a non-alloying process. In this embodiment, the heavily doped $p^+$ barrier layer 6 serves as a tunnel barrier layer for a carrier in the drain storage region.

A process of manufacturing the three-terminal memory shown in FIG. 8 according to the MLE process will be described below.

The three-terminal memory shown in FIG. 8 can be manufactured in substantially the same manner as the two-terminal memory according to the first embodiment, except that the gate region 11' is formed.

First, a gate mesa region is formed by ordinary photolithography. The gate mesa region has such a depth that the gate region can be connected to the $p^+$ barrier region 6. A molecular layer etching process or the like is effective to form the gate mesa region because the distance between the drain and the intrinsic gate is very small, i.e., ranges from several tens to several hundreds Å. For example, a chlorine gas is adsorbed to the surface at a low temperature near zero degree, and an ultraviolet radiation is applied to form a gate mesa region with controllability of about one molecular layer. A side wall is formed by highly selective anisotropic etching. This process is a low-damage process as it is effected at a low temperature and free from ion impacts such as in a plasma.

Therefore, this process and the molecular layer epitaxial growth process are optimum for fabricating a device having a multiple thin film structure of a very small thickness of about several Å.

After the gate mesa region is formed, a gate region 11' is formed again by regrowth. The gate region 11' may be a simple $p^+$ homojunction. A gate structure of a $p^+$ —i— $n^+$ junction with an $n^+$ or i layer on the side of a side wall of npn structure may be employed for the gate region 11'.

The p+ layer has a carrier density of $6\times10^{19}$/cc and a thickness of about 100 Å. The i layer has a carrier density of $1\times10^{16}$/cc and a thickness of about 100 Å. The $n^+$ layer has a carrier density of $4\times10^{19}$/cc and a thickness of several molecular layers. If the crystallinity of the $p^+$ layer which has a carrier density of $6\times10^{19}$/cc and contains a large quantity of impurity is poor, then the $p^+$ layer is constructed as a two-layer structure composed of a layer having a carrier density of $5\times10^{18}$/cc and a thickness of 250 Å and a $p^{++}$ layer having a carrier density of $6\times10^{19}$/cc.

To prevent the gate-to-source junction or the gate-to-drain junction from a breakdown due to tunnel injection, an i-GaAs layer having a thickness of about 100 Å is sufficient. For further improving the junction characteristics, an insulating film such as a silicon nitride film or the like is formed on a gate side wall, and thereafter a gate is regrown. The insulating film on the gate side wall contributes to an increase in the dielectric strength between the source region with a high-density impurity added thereto and the gate region. An AlGaAs hetero gate or an MIS gate formed by molecular layer epitaxial growth may also be employed insofar as it has a structure capable of controlling the tunnel barrier width or height according to the static induction effect.

Operation of the semiconductor device according to the third embodiment will be described below.

In FIG. 8, when information is to be written in and read from the three-terminal memory, a pulse voltage is applied to the gate 11 to the extent to lower or remote the potential existing in the channel region 5'. The height or effective width of the $p^+$ barrier layer 6 is lowered to reduce the resistance of the npn structure for writing and reading information. The three-terminal memory can operate faster than the two-terminal ping-pong memory. By applying the pulse voltage to the gate 11, the tunnel transition probability of the tunnel barrier layer 6 is increased to reduce the resistance of the npn structure for writing and reading bit information in and from the drain storage region.

To improve the holding characteristics of the memory cell, a reverse gate bias voltage is applied while electrons are being stored, and a gate pulse for canceling out the reverse gate bias voltage is applied when information is to be written and read. In this manner, the memory can operate at a high speed without increasing the writing and reading voltages. By applying a suitable gate bias, it is possible to lower the tunnel transition probability of the hetero barrier for writing and reading information.

Rather than developing a gate potential with a $p^+$ barrier layer according to the first embodiment or with a hetero barrier layer according to the second embodiment, a gate potential may be developed by a double hetero barrier or a multiple $p^+$ barrier layer of $np^+ np^+$ structure. With such a structure, a carrier stored in the drain storage capacitance can be read only when an external gate voltage is applied to equalize tunnel transitions in multiple quantum wells. Such an arrangement will be described below as a semiconductor device according to a fourth embodiment of the present invention.

According to the fourth embodiment, the barrier layer 6 shown in FIG. 8 is constructed as a very thin hetero structure having two layers of different thicknesses. The other details of the semiconductor device according to the fourth embodiment are identical to those of the semiconductor device according to third embodiment.

Operation of the semiconductor device with a multiple quantum well structure according to the fourth embodiment will be described below.

Figure 9:
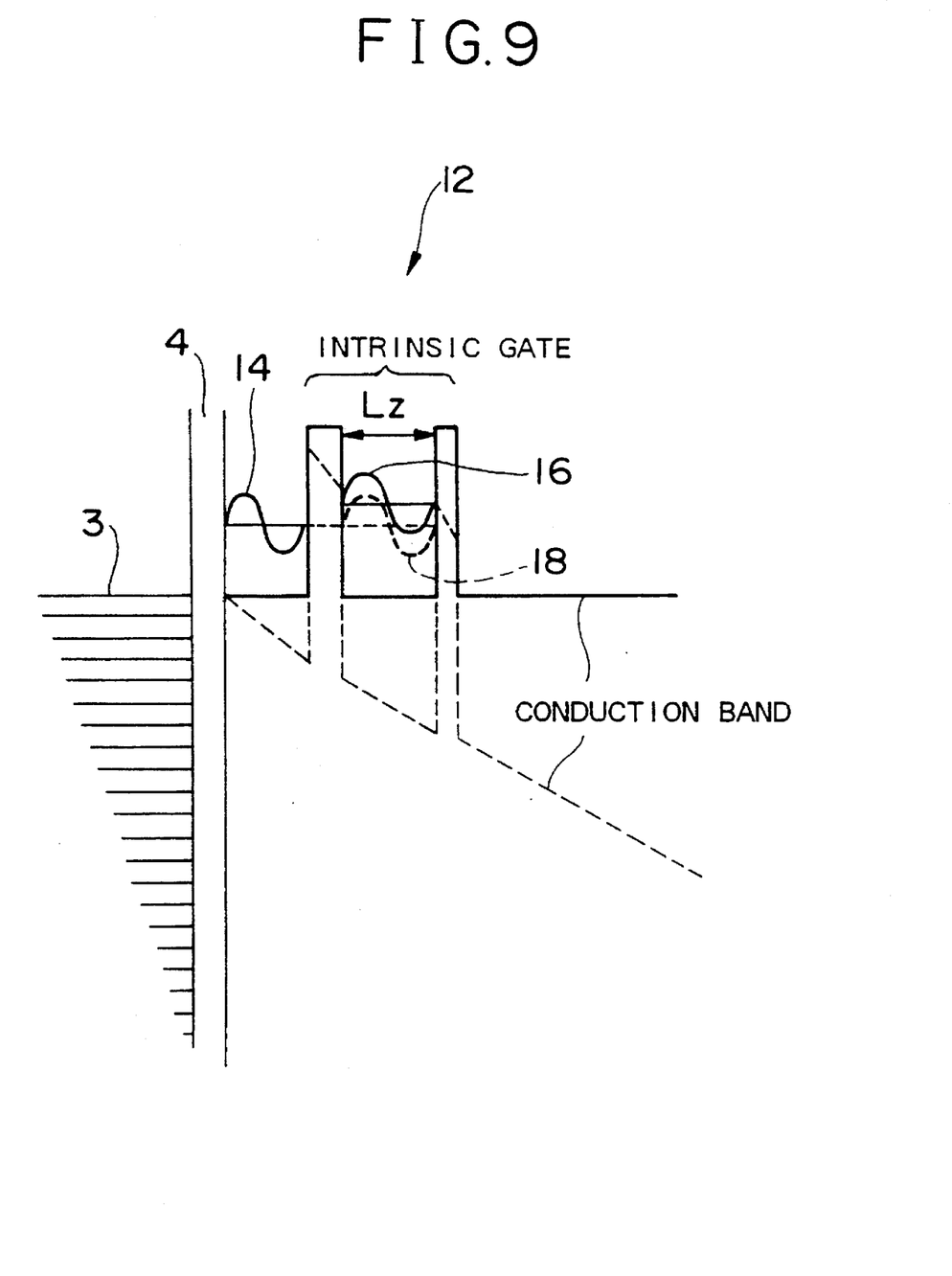
FIG. 9 is a schematic diagram showing a change in the potential distribution of a quantum well structure at the time when a zero bias and an external bias are applied, according to a fourth embodiment of the present invention.

FIG. 9 shows potentials of the multiple quantum well structure. In FIG. 9, the solid-line curve represents a potential distribution and a resonant level when zero bias is applied, and the dotted-line curve represents a potential distribution and a resonant level when an external bias voltage is applied.

A quantization level (or resonance level) developed in a quantum-well-like potential 12 has an inherent energy level En determined by a function of a quantum well width Lz and a degree number n as an integar as shown in FIG. 9. By determining suitable quantum well widths $Lz_1$, $Lz_2$, different quantization levels $En_1$, $En_2$ can be developed respectively in first and second quantum wells.

In an initial state, the quantization level $En_1$ (indicated at 14 in FIG. 9) and the quantization level $En_2$ (indicated at 16 in FIG. 9) do not agree with each other. Therefore, the tunnel transition probability is almost nil, with no carrier flow produced. For example, when a positive writing voltage pulse is applied to the surface metal electrodes 3 to lower the potential 10 thereof for thereby lowering the potential 12 of the barrier layer 6 due to the static induction effect, a quantization level $En_1$ (indicated at 14 in FIG. 9) and a quantization level $En_2$ (indicated at 18 in FIG. 9) developed respectively in the quantum wells are brought into agreement with each other. The tunnel transition probability of the potential 10 is increased to cause electrons to flow from the source region to the surface storage region in which the electrons are stored, thus completing a write operation. When the write operation is completed, the electrons are stored on the surface, bringing about an increase in the surface potential. However, since the quantization level $En_1$ (indicated at 14 in FIG. 9) and the quantization level $En_2$ (indicated at 18 in FIG. 9) developed respectively in the quantum wells are not equal to each other, almost no leak current flows through the barrier layer 6, so that the memory has good holding characteristics.

When a negative reading voltage pulse is applied to the surface metal electrodes 3 or a positive reading voltage pulse is applied to the source electrode thereby increasing the potential 10 of the surface metal electrodes 3 relatively to the semiconductor, the quantization level $En_1$ (indicated at 14 in FIG. 9) and the quantization level $En_2$ (indicated at 18 in FIG. 9) developed respectively in the quantum wells are equalized to each other. Inasmuch as there is produced a tunnel transition probability in the potential 9 of the barrier layer 6, electron moves from the charge storage region to the source region due to the tunneling, allowing stored information to be read at a very high speed.

A semiconductor device according to a fifth embodiment of the present invention will be described below.

The semiconductor device according to the fifth embodiment serves as a three-terminal transistor with the barrier layer 6 shown in FIG. 8 being of a homojunction. The homojunction is the same as that in the first embodiment.

In this embodiment, the distance L (see FIG. 10) between the drain storage region 2 shown in FIG. 8 and the potential 9 (see FIG. 10) of the intrinsic gate region formed by the tunnel barrier layer 6 is selected to be about the mean free path of carriers or less.

Figure 10:
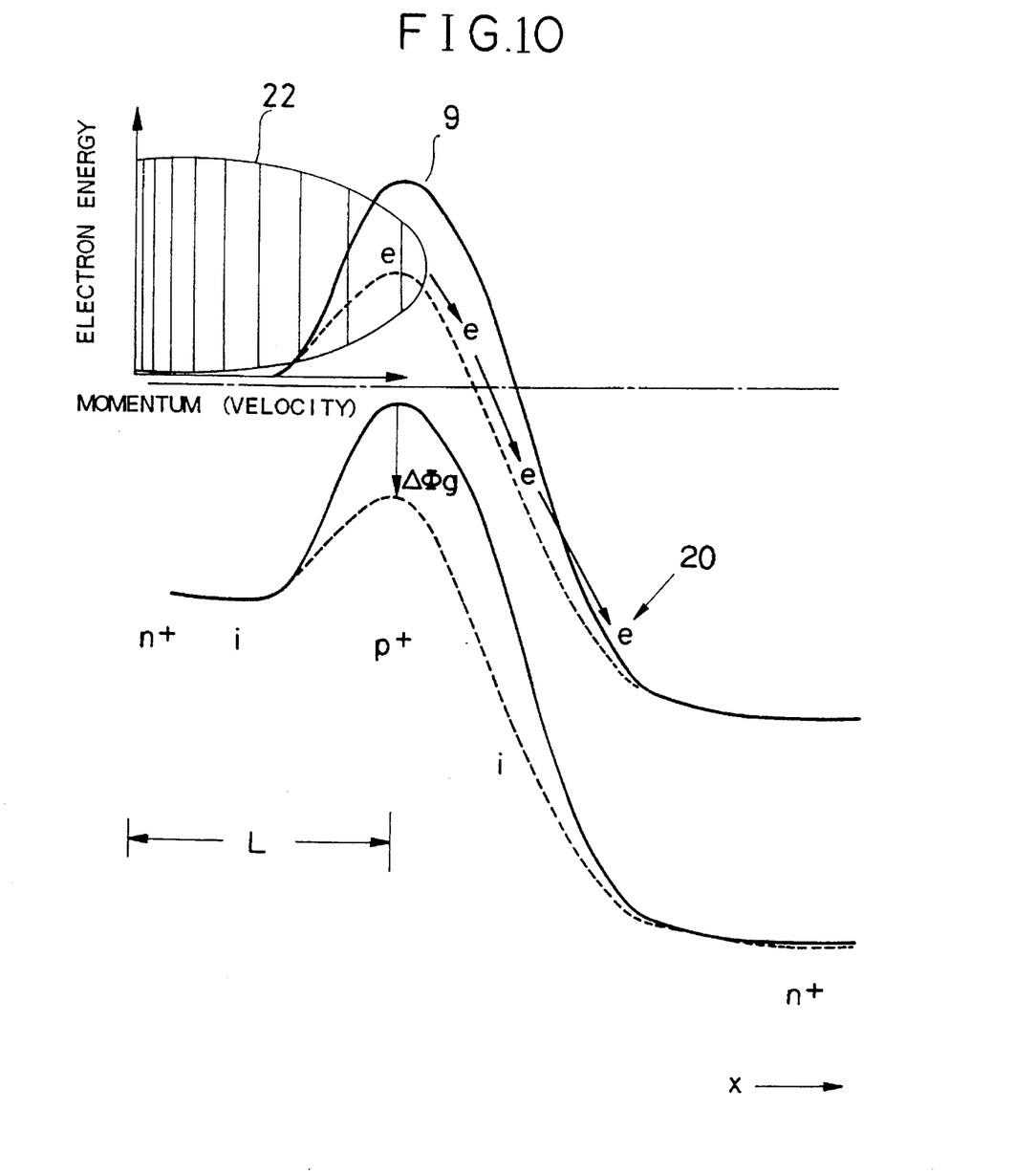
FIG. 10 is a schematic diagram showing potential distributions in the case where the distance between a drain storage region and an intrinsic gate potential saddle developed by a tunnel barrier layer is equal to or smaller than the mean free path of a carrier according to a fifth embodiment of the present invention.

The n⁻ channel layers 5, 5' should preferably be highly pure and free of defects so that no impurities will be diffused therein. In the case where they are made of GaAs, the distance between the drain storage layer 2 and the tunnel barrier layer varies depending on the carrier density of the n⁻ channel layer 5' positioned therebetween. If the carrier density ranges from about $1 \times 10^{14}/cc$ to $1 \times 10^{17}/cc$, then the distance is in the range of from about several tens A to several hundreds A.

The semiconductor device according to the fifth embodiment operates as follows:

FIG. 10 shows potential distributions and an electron energy distribution, which are indicative of the operation of the semiconductor device according to the fifth embodiment. In FIG. 10, a hatched region 22 represents the relationship between the energy and momentum of electrons.

When a voltage is applied to the gate electrode 11, the height and width of the potential 9 can be controlled to allow stored electrons 20 to move beyond the hill of the potential 10. Since a carrier stored in the storage region reaches the intrinsic gate region due to ballistic conduction, rather than diffusion, the rate of reading and writing information is increased.

In this embodiment, even though the semiconductor device is not of such a structure in which the carrier passes through the barrier layer owing to the tunneling, a change caused in a current by a change in the height of the potential barrier is much larger than an ordinary bipolar transistor. Therefore, the semiconductor device can produce a sufficient signal even if the number of carriers stored in a unit memory cell is reduced by a higher degree of circuit integration.

With the arrangement of the present invention, more specifically, there is developed a depletion layer in the barrier layer 6. When the carrier is stored from the source region into the storage region and drawn from the storage region into the source region in the writing and reading modes of the semiconductor memory, the carrier such as electrons moves in the barrier layer due to drift under an internal electric field. Therefore, the semiconductor device can operate at a high speed.

The height and width of the potential 9 of the barrier layer can be controlled by the static induction effect. The above operation of the semiconductor device represents operation of a transistor. Since a semiconductor memory comprises a combination of a storage capacitance and a transistor, and its operation is determined by the time constant for the transistor to charge and discharge the storage capacitance, the semiconductor memory can operate at a high speed.

In the semiconductor device according to the present embodiment, the carrier which is read and written is transferred by the tunneling. Consequently, the carrier can eventually be transferred at a high speed in a time range that can be observed according to the uncertainty principle. If a thermionic-radiation-type SIT is employed as a memory cell, then since the current changes greatly due to a gate potential change under a low bias voltage, the memory cell can operate without being affected by a noise level even when the number of electrons involved in the operation although the noise level itself is lower than that of conventional bipolar transistors. The semiconductor device can also be constructed as a dynamic memory capable of reading and writing bit information in a destructive manner, or a static memory capable of reading and writing bit information while retaining the same.

A semiconductor device according to a sixth embodiment will be described below. The semiconductor device according to the sixth embodiment differs from the semiconductor device according to the third embodiment in that the barrier layer 6 according to the third embodiment is composed of a very thin insulating layer. The other details of the semiconductor device are the same as those of the semiconductor device according to the third embodiment.

The very thin insulating layer in the sixth embodiment is grown to a thickness ranging from 1 to 150 Å. It is important that the interfacial defect density be lowered in depositing the very thin insulating layer. With the thickness of the insulating layer in this range, it is possible to control a potential distribution in the very thin insulating layer by applying a voltage to the gate electrode 11. Consequently, the semiconductor device according to the sixth embodiment operates in the same manner and offers the same advantages as the semiconductor device according to the fifth embodiment.

A semiconductor device according to a seventh embodiment will be described below.

In the previous embodiments, as shown in FIGS. 2 and 8, the storage capacitance comprises a MOS capacitor which is composed of the drain region 2, which is a high-density impurity-added layer, and the metal electrode 2 with the thin insulating film 4 interposed therebetween. According to the seventh embodiment, it is possible to store bit information according to an electric field effect produced by a structure of a semiconductor/an insulating film/high-density impurity-added drain layer, rather than the metal electrodes. At any rate, stored bit information can be read at a high speed by the tunneling through the very thin tunnel barrier layer which is disposed very closely to the storage layer, and written bit information can be retained well by the tunnel barrier layer.

As described above, the semiconductor device according to the present invention has a depletion layer in a very thin barrier layer, and allows the height and width of the potential of the very thin barrier layer to be controlled under an external electric field, and the very thin barrier layer serves as a tunnel barrier layer for permitting a carrier to be written and read by tunneling therethrough.

Since the carrier tunnels through an intrinsic gate region formed by the tunnel barrier layer, desired information can be read and written at a high speed. The semiconductor device suffers low noise as the tunneling is used to transfer the carrier, so that the semiconductor device can operate with a reduced number of electrons that contribute to the operation. The movement of the carrier by the tunneling permits the semiconductor device to have a low power requirement.

Where the semiconductor device is constructed as a semiconductor memory for storing a carrier, it is possible to eliminate a leak current which would otherwise be caused by the stored carrier, with the potential of the very thin barrier layer. Since the height and width of the potential of the very thin barrier layer can be controlled for tunneling, the stored carrier tunnels through the intrinsic gate region formed by the tunnel barrier layer, so that desired information can be read and written at a high speed.

With an arrangement in which a quantum-well-like potential distribution is developed, the gate potential can be controlled by a gate bias voltage. When quantization levels developed in the gate region are equalized to each other, there is produced a tunnel transition probability, allowing a charge to move. Since such a phenomenon is a quantum phenomenon, the response time can be shortened in principle to a limit time range that can be observed according to the uncertainty principle. As the charge is transferred by the tunneling, if the quantization levels developed in the gate region do not agree with each other, it is possible to block and retain bit information with a very small leak current.

In a semiconductor device having npn or pnp junctions between a drain region, a very thin barrier layer, and a source region with the very thin barrier layer interposed between the drain and source regions, there exist depletion layers which meet charge neutralizing conditions even if no channel layers are present, and the depletion layers serve as virtual channel layers. Inasmuch as the potential height and width of the depletion layers can be controlled by an external electric field, the semiconductor device can operate at a high speed and can be of a highly integrated circuit design.

In a semiconductor device wherein a drain region serves as a charge storage region and the distance between the charge storage region and the saddle of an intrinsic gate potential developed by a tunnel barrier layer is equal to or smaller than the mean free path of a carrier, the carrier stored in the storage region does not reach the intrinsic gate region by way of diffusion, but by way of ballistic conduction.

Consequently, even if the carrier does not tunnel through the potential of the barrier layer, a change in a current caused by a change in the height of the potential of the barrier layer can be increased, making it possible to in crease the operating speed of the semiconductor device. The semiconductor device can be of a highly integrated circuit design, and can produce a sufficient signal even if the number of stored carriers is reduced.

According to a process of fabricating a semiconductor device, the step of forming electrodes is not effected outside of a growing apparatus, but the deposition of a metal and the deposition of a low-resistance semiconductor are selectively or both carried out in the same location(in situ). Therefore, there is no processing step where the device being fabricated is exposed to air.

Consequently, no oxide film is produced on the surface of a crystal which has grown, so that a good electrode-to-semiconductor contact can be formed.

According to a process of forming a gate mesa region, the step of fabricating the gate mesa is not effected outside of a growing apparatus, but the device is selectively etched with a radiation at a low temperature in the same location. Therefore, an npn structure which is about one molecular layer thick is not damaged, and a side wall being formed is not damaged.

The surface is processed in an $AsH_3$ atmosphere in a step preceding the step of forming a source region. In this manner, a grown interface of good quality can be produced without damaging a very thin npn structure which is about one molecular layer thick.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the feature set out in the appended claims.

What is claimed is:

1. A semiconductor device comprising:

a semiconductor substrate:

a source region disposed on said semiconductor substrate;

a channel region disposed on said source region;

a drain region disposed on said channel region;

an insulating layer disposed on said drain region;

an electrode disposed on said insulating layer; and a very thin barrier layer disposed in said channel region between said source region and said drain region, said very thin barrier layer having a thickness and conductivity type which permits carrier movement therethrough by the tunnel effect, and having a potential developed therein which is controllable by an external voltage applied thereto to control the tunnel effect.

2. A semiconductor device comprising:

a semiconductor substrate;

a source region disposed on said semiconductor substrate;

a channel region disposed on said source region;

a drain region disposed on said channel region;

a charge storage layer disposed on said channel region;

an insulating layer disposed on said charge storage layer;

an electrode disposed on said insulating layer; and a very thin barrier layer disposed in said channel region between said source region and said drain region, said very thin barrier layer having a thickness and conductivity type which permits carrier movement therethrough by the tunnel effect, and having a potential developed therein which is controllable by an external voltage applied thereto to control the tunnel effect.

3. A semiconductor device comprising:

a semiconductor substrate;

a source region disposed on said semiconductor substrate;

a very thin barrier layer disposed on said source region;

a drain region disposed on said very thin barrier layer;

an insulating layer disposed on said drain region;

an electrode disposed on said insulating layer; and virtual channel layers formed by depletion layers in both junctions of:

a first junction between said source region and said barrier layer; and a second junction between said barrier layer and said drain region;

said very thin barrier layer having a thickness and conductivity type which operates by allowing carrier movement therethrough by the tunnel effect, and having a potential developed therein which is controllable by an external voltage applied thereto to control the tunnel effect, and said virtual channel layers being free of a metallurgical channel region.

4. A semiconductor device comprising:

a semiconductor substrate;

a source region disposed on said semiconductor substrate;

a first channel region disposed on said source region;

a very thin barrier layer disposed on said first channel region having a thickness and conductivity type which permits carrier movement therethrough by the tunnel effect for developing an intrinsic gate potential to control the tunnel effect;

a second channel region disposed on said very thin barrier layer;

a drain region disposed on said second channel region;

an insulating layer disposed on said drain region; and an electrode disposed on said insulating layer;

the arrangement being such that a distance between said drain region and a location of the intrinsic gate potential developed by said very thin barrier layer is equal to or less than a mean free path of carriers.

5. A semiconductor device according to claim 1, 2, 3, or 4, wherein said very thin barrier layer is of a Very thin homo junction structure.

6. A semiconductor device according to claim 1, 2, 3, or 4, wherein said very thin barrier layer is of a very thin hetero junction structure.

7. A semiconductor device according to claim 1, 2, 3, or 4, wherein said very thin barrier layer comprises a very thin insulating layer.

8. A semiconductor device according to claim 1, 2, 3, or 4, wherein said very thin barrier layer is formed of a very thin heterojunction for developing a quantum well potential.

9. A method of manufacturing a semiconductor device with a growing apparatus, comprising the steps of:

forming a source region on a semiconductor substrate;

forming a first channel region on said source region;

forming a barrier layer on said first channel region having a thickness and conductivity type which permits carrier movement therethrough by the tunnel effect;

forming a second channel region on said barrier layer;

forming a drain region on said second channel region;

forming an insulating layer on said drain region;

forming a surface electrode on said insulating layer over said drain region by depositing a metal and a low-resistance semiconductor selectively or both in situ within the growing apparatus; and forming a source electrode on said semiconductor substrate by depositing a metal and a low-resistance semiconductor selectively or both in situ within the growing apparatus.

10. A method according to claim 9, wherein said step of forming said source region includes the step of previously surface-treating a GaAs crystal substrate in an $AsH_3$ atmosphere at a predetermined temperature.

11. A method of manufacturing a semiconductor device, comprising the steps of:

forming a source region on a semiconductor substrate;

forming a first channel region on said source region;

forming a barrier layer on said first channel region having a thickness and conductivity type which permits carrier movement therethrough by the tunnel effect;

forming a second channel region on said barrier layer;

forming a drain region on said second channel region;

forming an insulating layer on said drain region;

forming a gate mesa in situ by an etching process with a radiation at a low temperature;

forming a gate region on said gate mesa;

forming a surface electrode on said insulating layer over said drain region; and forming a source electrode on said semiconductor substrate.

12. A method according to claim 11, wherein said etching process comprises a molecular layer etching process with a chlorine gas adsorbed to the surface of a GaAs crystal.

13. A method according to claim 11, wherein said step of forming said source region includes the step of previously surface-treating a GaAs crystal in an $AsH_3$ atmosphere at a predetermined temperature.

14. A device as in any of claims 1, 2, 3 or 4, wherein said very thin barrier layer has a thickness of multiple layers of molecules.

15. A device as in any of claims 1, 2, 3, or 4 wherein said barrier layer has a conductivity type which is opposite to a conductivity type of one of said channel region or said insulation layer.

* * * * *